United States Patent [19]

Martinelli et al.

[11] 4,383,268
[45] May 10, 1983

[54] HIGH-CURRENT, HIGH-VOLTAGE SEMICONDUCTOR DEVICES HAVING A METALLURGICAL GRADE SUBSTRATE

[75] Inventors: Ramon U. Martinelli, Hightstown; Norbert W. Brackelmanns, Ironia; Paul H. Robinson, Lawrenceville, all of N.J.

[73] Assignee: RCA Corporation, New York, N.Y.

[21] Appl. No.: 166,347

[22] Filed: Jul. 7, 1980

[51] Int. Cl.³ .................. H01L 29/72; H01L 27/14; H01L 29/167

[52] U.S. Cl. .................. 357/34; 357/30; 357/63

[58] Field of Search .......... 357/34, 30, 61, 60, 357/59, 63

[56] References Cited

U.S. PATENT DOCUMENTS 3,648,123  3/1972  Ernick et al. ............... 357/340 R
3,660,171  5/1972  Tsuchimoto et al. ......... 357/34 X
4,124,410  11/1978  Kotval et al. ............... 357/30 X
4,249,957  2/1981  Koliwad et al. ............. 357/30 X

OTHER PUBLICATIONS

T. Warabisako, T. Saitoh, H. Itoh, N. Nakamura and T. Tokuyama, "Polycrystalline solar cells on metallurgical-grade silicon substrates", *Japanese Journal of Applied Physics*, vol. 17 (1978) Supplement 17-1, pp. 309–314.

*Primary Examiner*—Martin H. Edlow
*Assistant Examiner*—J. Carroll
*Attorney, Agent, or Firm*—Birgit E. Morris; Donald S. Cohen; Robert Ochis

[57] ABSTRACT

A high-current, high-voltage semiconductor device is fabricated on a metallurgical grade substrate of a first conductivity type by first growing an epitaxial layer of the first conductivity type on the substrate and then fabricating a semiconductor device thereon designed for high-current, high-voltage applications.

4 Claims, 2 Drawing Figures

PRIOR ART SOLAR CELL

HIGH-CURRENT, HIGH-VOLTAGE SEMICONDUCTOR DEVICES HAVING A METALLURGICAL GRADE SUBSTRATE

FIELD OF THE INVENTION

The invention relates to the field of high-current, high-voltage semiconductor devices.

PRIOR ART

Single crystalline boules of semiconductor-grade silicon are expensive (in the neighborhood of $100.00 per kilogram in the boule form). This high cost follows from the high purity required for semiconductor grade silicon. Silicon from a source such as sand must be converted to silicon tetrachloride in order to reject impurities or subjected to multiple float zone refinings. The silicon tetrachloride is then converted back to high purity polycrystalline silicon. Multiple zone refinings convert the high purity polycrystalline silicon to good quality semiconductor material in boule form, which is free of impurities and dislocations. As an alternative to the multiple zone refinings, Czochralski growth may be used, but this process produces material with on the order of 100 dislocations per $cm^2$ of final wafer surface.

Metallurgical grade silicon is produced by placing sand or quartz in an arc furnace and reducing the material to silicon. This is a non-purified material and is relatively inexpensive. Metallurgical grade silicon is used in the manufacture of steel.

With the increasing interest in solar power, techniques for building solar cells from material cheaper than semiconductor grade silicon have been sought. One technique is to grow an epitaxial layer of silicon from semiconductor grade source material on a substrate of a lesser grade. One such substrate material that has been under investigation is so called upgraded metallurgical grade silicon, which is produced by the Dow Chemical Corporation with a minimum of purification and recrystallization. This material contains significant quantities of aluminum, boron, phorphorus, oxygen and carbon, and in the form of single crystalline boules, it yields wafers having on the order of $10^4$ dislocations per $cm^2$. However, this material is on the order of $10.00 per kilogram in boule form.

Experimental solar cells have been fabricated utilizing the Dow upgraded metallurgical grade silicon by growing a 15 to 20 micron thick P-type epitaxial layer on the P-type substrate of this material and then diffusing a N-type region into the surface of the epitaxial layer.

This process makes relatively inexpensive solar cells possible, which have their active regions fabricated in semiconductor quality material. This is inexpensive because a much smaller amount of semiconductor grade material is used than is used when a semiconductor grade boule is used. This is because the substrate is about 8 to 20 times thicker than the epitaxial layer.

Over the next few years and possibly over a longer term, a shortage of semiconductor grade polycrystalline silicon is anticipated. It is, therefore, desired to build as many devices as possible with that material which will be available. Since the semiconductor industry is highly competitive it is also desired to build such devices as inexpensively as possible. No technique has been developed that is effective for high current semiconductor devices and enables them to be made inexpensively while conserving semiconductor grade silicon.

SUMMARY OF THE INVENTION

The present invention overcomes these problems of the prior art by fabricating power semiconductor devices in epitaxial layers grown on single crystalline metallurgical grade silicon. In a preferred embodiment, a collector region on the order of 10 microns thick is epitaxially grown on a metallurgical grade substrate of the same conductivity type after which an opposite conductivity type base region on the order of 10 microns thick is grown on the epitaxial collector region. The emitter is preferably diffused into the base region.

DETAILED DESCRIPTION OF THE INVENTION

Figure 1:
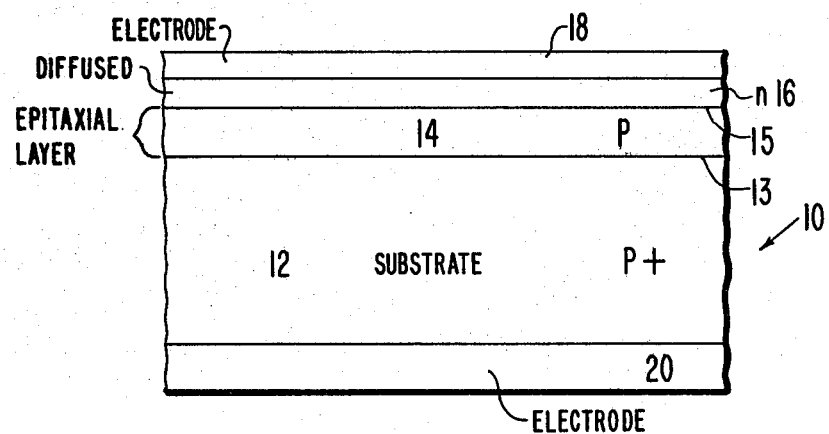
FIG. 1 is a cross-section of a prior art solar cell fabricated on a metallurgical grade substrate.

A prior art solar cell 10 comprises an upgraded metallurgical grade P type substrate 12 on which a P-type epitaxial layer 14 approximately 15 to 20 microns thick has been grown and into which has been diffused a N-type region 16 approximately 0.2 microns thick. A top electrode 18 provides ohmic contact to the N layer 16. A bottom electrode 20 provides ohmic contact to the P+ type upgraded metallurgical substrate 12.

This structure is fabricated by growing the epitaxial layer 14 at approximately 1100° C. for about ten minutes. Subsequently, the non-patterned N-type region 16 is diffused into the epitaxial layer 14 at 900° C. for twenty minutes. The upper and lower electrodes are subsequently formed on the structure. The epitaxial growth and the diffusion processes are the only high temperature processes to which these devices are exposed.

Devices of this type must have breakdown voltages of their PN junction 15 on the order of at least 1.0 volt in order to operate properly. The maximum current density in these devices is normally in the range of tens of milliamps per $cm^2$ or less. This is a very low current density as compared with the current densities present in power semiconductor devices. The currents in solar cells flow vertically through the structure and are the result of the formation of hole/electron pairs in the upper $10\mu$ of this structure in response to the absorption of light having an energy greater than the band gap energy of silicon material. In operation, holes generated within the depletion 16 region of the PN junction 15 or between the PN junction 15 and the electrode 18 are swept or diffuse to the P-region 14. Electrons generated within the depletion region of the PN junction 15 or in the material between there and the electrode 20 are swept or diffuse to the N-region 16. These two flows of charge carriers combine to constitute the external current generated by the solar cell.

Typical impurities in metallurgical grade silicon are set forth in the following table along with their typical concentrations.

TABLE

| TYPICAL IMPURITIES IN MG Si | |
|---|---|
| Impurity | Concentration ppm |
| Al | 1300 |

TABLE-continued

| TYPICAL IMPURITIES IN MG Si | |
|---|---|
| Impurity | Concentration ppm |
| B | 11 |
| Ca | 250 |
| Cr | 390 |
| Cu | 60 |
| Fe | 4200 |
| Mg | <5 |
| Mn | 120 |
| Ni | 100 |
| P | 10 |
| Ti | 500 |
| V | 230 |
| Zr | 30 |

Aluminum, boron and phosphorus are active dopants in silicon. The metals Cu, Au, Ti, Mn, Mg and V are lifetime killers. In the upgraded metallurgical grade silicon obtained from Dow Chemical the only dopants detectable by spark source mass spectrometry are aluminum, boron and phosphorus. Since the lower limit on detectability in this type of mass spectrometer, is about twenty parts in $10^6$, any of the other dopants may be present in quantities up to that detectability limit. Oxygen and carbon have also been found in detectable quantities. In semiconductor devices quantities of the lifetime destroying dopants as small as one part in $10^{10}$ adversely effect device performance by reducing the lifetime of the minority carriers. Due to the short exposure time of the solar cell structure to high temperatures (ten minutes at 1100° C. and twenty minutes at 900° C.) the lifetime destroying impurities would not have time to diffuse from the substrate to the active portion of the device.

Upgraded metallurgical grade silicon is expected to contain the lifetime killing impurities in quantities substantially greater than one part in $10^{10}$. To remove these impurities, the material would either have to go through the silicon tetrachloride transfer process, or on like it, or else it would have to undergo multiple zone refining relying on the segregation co-efficients of these heavy metals to remove them from the material. Upgraded metallurgical grade silicon has not undergone either of these expensive refining processes, which makes it as inexpensive as it is. Consequently, these impurities are expected to be present in this material in quantities sufficient to limit the minority carrier lifetime.

Figure 2:
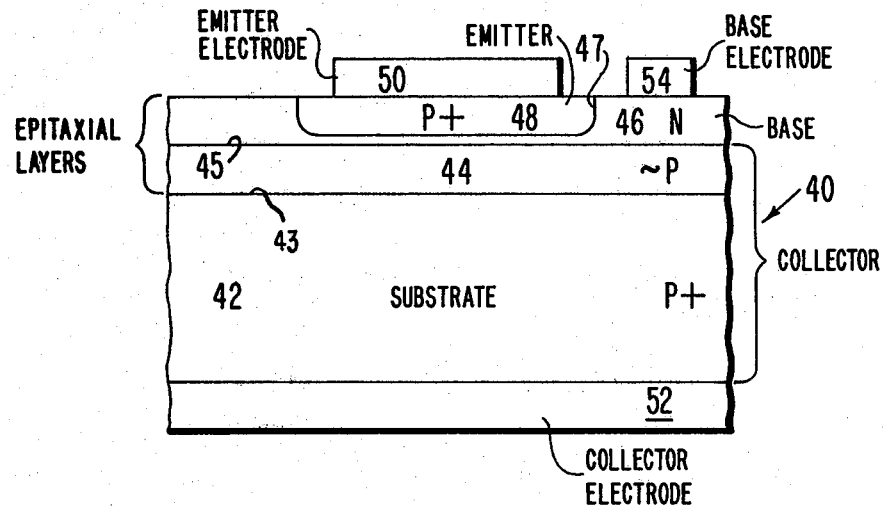
FIG. 2 is a cross-section of a bipolar power transistor fabricated on a metallurgical grade substrate.

FIG. 2 illustrates a bipolar transistor shown generally at 40 fabricated on an upgraded metallurgical grade P-type substrate 42 of monocrystalline silicon. This device is fabricated by epitaxially growing a layer 44 of P-type semiconductor grade silicon approximately 10 microns thick. A silicon N-type base region 46 is then grown approximately 10 microns thick on top of the P layer 44 without removing the substrate from the epitaxial reactor and by changing the dopant gas. To grow these epitaxial layers the structure is exposed to 1100° C. for about ten to fifteen minutes. The device is then exposed to an oxidizing atmosphere at 1100° C. for about three hours to grow a thick oxide layer to serve as a diffusion mask for the emitter diffusion. An opening corresponding to the desired area of the emitter diffusion is made in the oxide layer. The device is then exposed to 1155° C. for sixty minutes to drive a boron dopant into the base region 46 in accordance with the pattern determined by the oxide layer. This forms the patterned emitter region 48.

The device is then metallized with an emitter electrode 50 contacting the emitter region, a collector electrode 52 contacting the substrate 42 and a base electrode 54 contacting the base region.

The exposure of the epitaxial layers to 1100° C. for three hours and to 1155° C. for one hour would be expected to cause lifetime destroying dopants to diffuse from the substrate 42 into the epitaxial layers 44 and 46 thereby destroying the gain of the device both at low and high currents. Further, any dislocations at the interface 43 between the substrate 42 and the layer 44 would be expected to collect impurities (become decorated) thereby creating recombination centers.

When operating at high currents, the base collector junction 45 tends to become forward biased and tends to inject electrons into the collector epitaxial layer 44. If the lifetime in the collector layer 44 is high, these electrons will reach the substrate/epitaxial layer interface 43 where the recombination centers associated with dislocations are expected to cause recombination of these electrons. As a result of recombination these electrons do not contribute to the collector current. Since these electrons are supplied by the base current, the result is a reduction in the gain of the device at high currents.

We have found that a 2N6107 device constructed in the above-specified manner is indistinguishable from similar 2N6107 devices fabricated on semiconductor grade monocrystalline silicon wafers. A complete description of 2N6107 devices can be found in "RCA Power Devices", Publication SSD-220B, 1978, pp. 190-196. Both sets of devices were processed together and thus should be identical except for their substrate material. The low-current gain of the devices is the same, the behavior of gain with increasing current is the same and in reliability testing the devices are the same. In view of this indistinguishability, it is concluded that any lifetime destroying dopants present in the substrate 42 do not adversely effect the device operation either by decorating dislocations at the interface 43 between the substrate 42 and the layer 44 or by destroying the lifetime in the layers 44 and 46. In consequence this constitutes a viable procedure for fabricating low cost power transistors and conserving semiconductor grade polycrystalline silicon material.

In operation at high current levels, (7 amperes through the 3200 sq. mil (0.02 $cm^2$) emitter area of this device) current densities on the order of 340 amperes per $cm^2$ cross the substrate-epitaxial layer interface 43. This is on the order of from about 1000 to more than about 10,000 times the current densities present in the prior art solar cells. Also, the breakdown voltage of the base-collector pn junction needs to be 80 volts. Under these conditions of high current or voltage the detailed characteristics of the interface between the epitaxial collector layer 44 and the substrate layer 42 are critical to device performance. This is particularly true in the case of this switching type transistor which needs a high current gain at high currents for fast switching and current handling. The problems expected at the epitaxial layer-substrate layer interface 43 are of a character that would not be expected to show up in the solar cell environment at its low current densities and low voltages but which would be expected to affect adversely the characteristics of the 2N6107 transistor. Further, the presence of the dopants and dislocations would be expected to create increased reverse leakage currents in these transistors devices, but such increases were not found.

Since the successful fabrication of these devices has established that high-current densities across the epitaxial layer/substrate layer interface 43 are feasible, this same material combination of the upgraded metallurgical grade silicon substrate with epitaxial layers thereon is also suitable for the fabrication of power Fet's in which the main current passes in a vertical direction through the structure.

For purpose of this specification metallurgical grade silicon is defined as silicon which has not undergone those purification processes which would be necessary to convert it to semiconductor grade silicon.

For purposes of this specification nominal current rating is defined as the maximum current which the device is expected to safely handle without deteriorating.

A device structure for reduced cost power devices has been shown and described. Those skilled in the art will be able to modify the illustrated structures such as by starting with an N+ substrate and building an NPN device or by using this structure to fabricate integrated circuits, all without departing from the scope of the invention as defined in the appended claims.

What is claimed is:

1. A power semiconductor transistor, comprising:
   a substrate comprising upgraded metallurgical grade silicon of a first conductivity type;
   a first silicon epitaxial layer disposed on said substrate and having said first conductivity type;
   said first epitaxial layer and said substrate having an interface therebetween;
   a second silicon epitaxial layer, of second conductivity type, disposed on said first layer;
   a diffused region, of first conductivity type, extending into the second epitaxial layer from the surface thereof;
   said transistor having a nominal current rating at which a current density of at least 10 amperes per $cm^2$ crosses said interface when the transistor is conducting a current equal to its nominal current rating.

2. The device recited in claim 1 further comprising:
   at least first and second main electrodes for connection in a circuit in which said transistor is to control current flow and a control electrode for controlling the state of the transistor with respect to conduction through the transistor between said first and second main electrodes, the first electrode contacting said diffused region, the second electrode contacting said substrate, and the control electrode contacting said second epitaxial layer.

3. The device recited in claim 2 wherein said first main electrode is an emitter electrode, said second main electrode is a collector electrode and said control electrode is a base electrode.

4. The device recited in claim 1 wherein said current density is at least 100 amperes per square centimeter.

* * * * *